US008125092B2

(12) United States Patent
Corisis et al.

(10) Patent No.: US 8,125,092 B2
(45) Date of Patent: Feb. 28, 2012

(54) SEMICONDUCTOR DEVICE PACKAGES AND ASSEMBLIES

(75) Inventors: David J. Corisis, Nampa, ID (US); Lee Choon Kuan, Singapore (SG); Chong Chin Hui, Singapore (SG)

(73) Assignee: Micron Technology, Inc., Boise, ID (US)

( * ) Notice: Subject to any disclaimer, the term of this patent is extended or adjusted under 35 U.S.C. 154(b) by 399 days.

(21) Appl. No.: 12/107,622

(22) Filed: Apr. 22, 2008

(65) Prior Publication Data

US 2009/0236735 A1 Sep. 24, 2009

(30) Foreign Application Priority Data

Mar. 19, 2008 (SG) ............................. 200802204-8

(51) Int. Cl.
 *H01L 23/48* (2006.01)
 *H01L 23/52* (2006.01)
 *H01L 29/40* (2006.01)

(52) U.S. Cl. ........................................ 257/784; 257/787

(58) Field of Classification Search .................. 257/686, 257/777, 723, 724, 787, 784, 786
See application file for complete search history.

(56) References Cited

U.S. PATENT DOCUMENTS

| 7,205,656 | B2 | 4/2007 | Kim et al. |
|---|---|---|---|
| 7,298,033 | B2 | 11/2007 | Yoo |
| 7,429,787 | B2 | 9/2008 | Kamezos et al. |
| 7,485,969 | B2 | 2/2009 | Corisis et al. |
| 7,504,284 | B2 | 3/2009 | Ye et al. |
| 2005/0040529 | A1 | 2/2005 | Lee |
| 2007/0158810 | A1 | 7/2007 | Song et al. |
| 2007/0257348 | A1 | 11/2007 | Yang |
| 2008/0061421 | A1* | 3/2008 | Shen et al. ..................... 257/686 |
| 2009/0152701 | A1* | 6/2009 | Kuan et al. ..................... 257/686 |
| 2010/0181661 | A1* | 7/2010 | Takemoto et al. ............. 257/686 |
| 2010/0200976 | A1* | 8/2010 | Nishiyama et al. ............ 257/686 |

FOREIGN PATENT DOCUMENTS

WO 2007025127 A2 3/2007

* cited by examiner

*Primary Examiner* — S. V. Clark
(74) *Attorney, Agent, or Firm* — TraskBritt (57) ABSTRACT

A semiconductor device package includes a carrier, one or more semiconductor devices on the carrier, and a redistribution element above the uppermost of the one or more semiconductor devices. The redistribution element includes an array of contact pads that communicate with each semiconductor device of the package. The package may also include an encapsulant through which the contact pads of the redistribution element are at least electrically exposed. Methods for assembling and packaging semiconductor devices, as well as methods for assembling multiple packages, including methods for replacing the functionality of one or more defective semiconductor devices of a package according to embodiments of the present invention, are also disclosed.

22 Claims, 5 Drawing Sheets

SEMICONDUCTOR DEVICE PACKAGES AND ASSEMBLIES

BACKGROUND

The present invention, in various embodiments, relates generally to the packaging of electronic components such as integrated circuits, as incorporated in semiconductor devices. Specific embodiments of the present invention include semiconductor device packaging and fabrication devices in which one or more semiconductor packages, each including multiple semiconductor devices within an encapsulant, are operably coupled. Embodiments of the present invention also include methods for repairing and/or replacing one or more inoperable semiconductor devices within a multiple semiconductor device assembly.

TECHNICAL FIELD

The amount of surface area on a carrier substrate that may be saved by stacking semiconductor devices is readily apparent; a stack of semiconductor devices consumes roughly the same amount of "real estate" on a carrier substrate, such as a circuit board, as a single, horizontally oriented semiconductor device or semiconductor device package. In order to conserve the amount of surface area consumed on a carrier substrate by semiconductor devices connected thereto, various types of increased density packages have been developed.

One of the more popular semiconductor package types is the multi-chip module (MCM). MCMs may be attached to and/or arranged on a substrate using flip-chip attachments, chip-on-board (COB), board-on-chip (BOC) configurations, or otherwise.

Flip-chip attachment generally consists of attaching an active surface of a semiconductor die to a substrate with a plurality of conductive bumps therebetween. Each conductive bump aligns and corresponds with respective contact pads on the substrate and the semiconductor die to provide electrical interconnection therebetween. The semiconductor die is bonded to the substrate by reflowing the conductive bumps, after which an underfill material is typically disposed between the semiconductor die and the substrate for environmental protection and to enhance the attachment of the semiconductor die to the substrate.

Turning to the COB and the BOC configurations, the semiconductor die is directly attached to the surface of a substrate, i.e., printed circuit board, interposer, carrier substrate, with an appropriate adhesive, such as an epoxy or adhesive tape. The die may be oriented either face up or face down (with its active surface and contact pads either up or down with respect to the circuit board) for wire bonding. A bond wire is then discretely attached to each contact pad on the semiconductor die and extended to a corresponding contact on the substrate.

Unfortunately, existing stacked MCMs are not expandable. For example, if more memory or an additional function is desired, the semiconductor package or the card carrying one or more semiconductor packages needs to be removed and subsequently replaced with another semiconductor package and/or card that contains more memory or the desired additional function.

Another disadvantage with current multi-die semiconductor packages and arrangements becomes clear when a semiconductor die within such a package fails or becomes otherwise inoperable. In such an instance, the conventional response to such failure or malfunction is replacement of the entire package.

DETAILED DESCRIPTION

Figure 1:
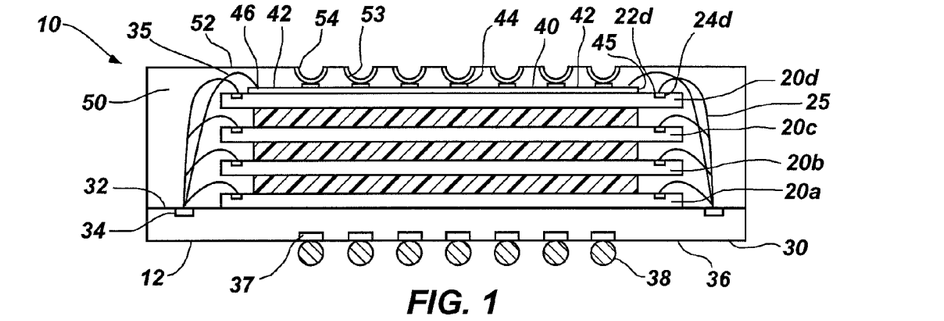
FIG. 1 is a representation of an embodiment of a semiconductor device package according to the present invention.

With reference to FIG. 1, an embodiment of an upgradeable and/or repairable semiconductor device package 10 of the present invention is shown. As depicted, semiconductor device package 10 may, in some embodiments, be a multi-chip module (MCM) with four semiconductor devices 20a, 20b, 20c, and 20d (which, for the sake of simplicity, may also be collectively referred to hereinafter as "semiconductor devices 20") in stacked arrangement. The lowermost semiconductor device 20a is secured to a carrier 30. A redistribution element 40 is located over the uppermost semiconductor device 20d. An encapsulant 50 may be located over the redistribution element 40 and may surround lateral edges of semiconductor devices 20 and cover a portion of a surface 32 of carrier 30. Apertures 53 in the encapsulant 50 expose contact pads 44 of the redistribution element 40, enabling the electrical connection of at least one additional semiconductor device package to semiconductor device package 10 and, thus, facilitating the upgrade and/or repair of semiconductor device package 10.

In the illustrated embodiment, carrier 30 is a circuit board. Carrier 30, may, however, be any other suitable, known element with conductive routes for establishing electrical connections between semiconductor devices 20 and electronic devices (not shown) that are external to semiconductor device package 10. Other embodiments of carriers 30 include, but are not limited to, leads, interposers, and other semiconductor devices (e.g. processors, etc.).

In some embodiments, discrete conductive structures 38 may protrude from contacts 37 (e.g., terminals, conductive vias, etc.) on a bottom surface 36 of carrier 30. Discrete conductive structures 38 may, in some embodiments, be arranged in an array (e.g., a grid array, etc.) across surface 36. Discrete conductive structures 38 may comprise any suitable material (e.g., solder, metal, conductive or conductor-filled elastomer, etc.) formed to have any suitable configuration (e.g., balls, bumps, pins, studs, columns, pillars, etc.).

Semiconductor devices 20 may, in some embodiments, have the same or substantially the same functionality (e.g., memory, processing, etc.) as one another. In a more specific embodiment, each semiconductor device 20a, 20b, 20c, 20d may be an identical dynamic random access memory (DRAM) device. In another particular embodiment, each semiconductor device 20a, 20b, 20c, 20d may be a NAND flash memory device (e.g., a standard NAND flash memory device, a high-speed NAND flash memory device, etc.). Other embodiments of semiconductor device package 10 include one or more semiconductor devices 20a, 20b, 20c, 20d that comprise a different type of device than one or more of the other semiconductor devices 20a, 20b, 20c, 20d and, thus, have different functionalities from one or more of the other semiconductor devices 20a, 20b, 20c, 20d.

While there are four semiconductor devices 20 in the illustrated embodiment of semiconductor device package 10, semiconductor device packages with other numbers of semiconductor devices are also within the scope of the present invention. In this regard, some embodiments of semiconductor device packages according to the present invention may have as few as one semiconductor device, while other embodiments may have as many semiconductor devices as remain feasible with available technologies, such as wire bonding, tape-automated bonding or TAB, and the like, for electrically connecting stacked semiconductor devices, and with the number of contacts 34 that may be provided upon a carrier 30 and the number of contact pads 44 that may be provided by a redistribution element 40.

Intermediate conductive elements 25 extend between and are conductively coupled to contact pads 24 on a surface 22 (e.g., the active, or upper, surface) of each semiconductor device 20 and corresponding contacts 34 (e.g., contact pads, terminals, leads, etc.) on surface 32 of carrier 30. In this way, each intermediate conductive element 25 electrically connects a contact pad 24 and its corresponding contact 34. Each intermediate conductive element 25 in the embodiment of semiconductor device package 10 shown in FIG. 1 is a bond wire. Semiconductor device packages with other types of intermediate conductive elements, including, but not limited to conductive traces carried by flexible dielectric film (i.e., TAB connections), leads, and the like may be fabricated.

Redistribution element 40 is located on surface 22d of the uppermost semiconductor device 20d in the embodiment show in FIG. 1. Without limiting the scope of the present invention, redistribution element 40 may, in some embodiments, comprise an interposer (e.g., a silicon-based interposer, a flexible, or "tape," substrate, etc.) that has been adhered to a surface of the uppermost semiconductor device 20d. In other embodiments, redistribution element 40 may be a redistribution layer (RDL) that has been fabricated on a surface of the uppermost semiconductor device 20d.

Redistribution element 40 includes laterally extending conductive traces (not shown) that lead to contact pads 44 arranged over a surface 42 (e.g., in a grid array, etc.) of redistribution element 40. The arrangement of contact pads 44 on surface 42 may correspond to, or complement, the arrangement of discrete conductive structures of another semiconductor device package, such as the arrangement of discrete conductive structures 38 protruding from the carrier 30 of another semiconductor device (e.g., another semiconductor device package 10 of the present invention) (see, e.g., FIG. 13), that may be assembled with semiconductor device package 10. These and other conductive features of redistribution element 40 may be at least partially electrically isolated from conductive features on surface 22d of semiconductor device 20d by way of dielectric material of redistribution element 40.

In some embodiments, conductive traces (not shown) communicate with (e.g., are electrically connected to) contact pads 24d of semiconductor device 20d. In other embodiments, conductive traces extend laterally inward (i.e., away from peripheral edges 45 of redistribution element 40) from contact pads 46 located adjacent to one or more peripheral edges 45 of redistribution element 40. Still other embodiments include combinations of these features.

Conductive races (not shown), contact pads 44, and other conductive features of redistribution element 40 may communicate with each semiconductor device 20 of semiconductor device package 10. In embodiments where conductive traces of redistribution element 40 are electrically connected to contact pads 24d of the uppermost semiconductor device 20d electrical communication between the underlying semiconductor devices 20a, 20b, and 20c and redistribution element 40 may be established by way of intermediate conductive elements 25, circuitry of carrier 30, and circuitry on (e.g., in the form of a redistribution layer) or within the uppermost semiconductor device 20d.

In embodiments where conductive traces of redistribution element 40 extend laterally inward from contact pads 44, intermediate conductive elements 35 are positioned between and electrically coupled to contact pads 44 and corresponding contacts 34 of carrier 30 to establish communication between redistribution element 40 and one or more semiconductor devices 20. Like intermediate conductive elements 25, intermediate conductive elements 35 may comprise bond wires, conductive traces carried by flexible dielectric film (i.e., TAB connections), leads, or any other conductive elements suitable for establishing electrical communication between two features that are laterally spaced apart and, optionally, vertically spaced apart from one another.

Some embodiments of semiconductor device package 10, such as that depicted in FIG. 1, include encapsulant 50, which may cover a majority of the area of surface 42 of redistribution element 40. In embodiments where encapsulant 50 covers surface 42 of redistribution element 40, contact pads 44 may be exposed through apertures 53 that are formed in and extend through encapsulant 50. In addition to covering portions of surface 42 of redistribution element 40, encapsulant 50 may also laterally surround semiconductor devices 20, coating and protecting intermediate conductive elements 25 that extend between semiconductor devices 20 and carrier 30, as well as any intermediate conductive elements 35 that extend between carrier 30 and redistribution element 40.

In addition to exposing contact pads 44, the surfaces of apertures 53 may, in some embodiments, be coated with conductive liners 54. In some embodiments, each conductive liner 54 may comprise ball-limiting metallurgy (BLM) or under-bump metallurgy (UBM) of a type known in the art. Each conductive liner 54 may be configured to enhance retention (e.g., by adhesion, creation of an interference fit, etc.) of a discrete conductive structure 38 within its corresponding aperture 53, as well enhancing electrical communication between a discrete conductive structure 38 and its corresponding contact pad 44.

Encapsulant 50 may comprise any suitable packaging material, such as a quantity of molded material (e.g., a material, such as a plastic or resin, optionally having a filler material therein, suitable for use in transfer molding processes, pot molding processes, injection molding processes, etc.).

Figure 2:
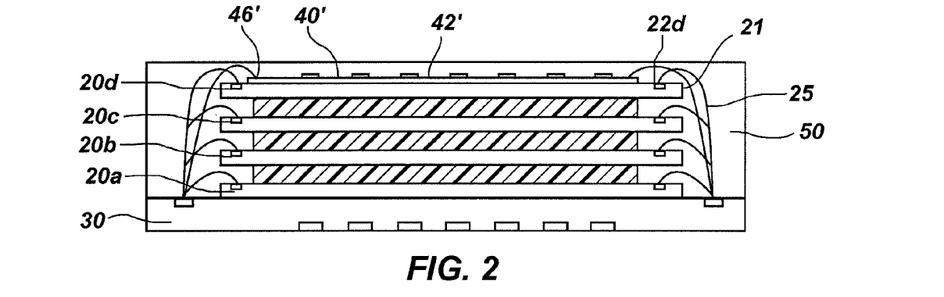
FIGS. 2 through 6 depict an embodiment of a method for assembling and packaging semiconductor devices.

An embodiment of a method for forming various embodiments of semiconductor device packages 10 of the present invention is shown in FIGS. 2 though 6.

In FIG. 2, at least one semiconductor device 20 is secured and electrically connected to carrier 30. Semiconductor device 20 may be secured to carrier 30 with a suitable adhesive material or adhesive-coated element of a type known in the art. Communication may be established between contact pads 24 (FIG. 1) of semiconductor device 20 and corresponding contacts 34 (FIG. 1) of carrier 30 (i.e., they may be electrically connected to one another) by forming or placing intermediate conductive elements 25 therebetween. In embodiments where the resulting semiconductor device package 10 is to include more than one semiconductor device 20, one or more additional semiconductor devices 20b, 20c, etc., may be sequentially adhered to an underlying semiconductor device 20a, 20b, etc., and electrically connected to carrier 30 in the same manner.

The uppermost semiconductor device 20d includes a redistribution layer 40', which was previously fabricated over a surface 22d of semiconductor device 20d by known processes and communicates with circuitry of semiconductor device 20d or circuitry carried by semiconductor device 20d. In some embodiments, circuitry (e.g., conductive traces, FIG. 1) of redistribution layer 40' communicate indirectly with carrier 30 and, thus, with any underlying semiconductor devices 20a, 20b, 20c through intermediate conductive elements 25 that extend between contact pads 24 (FIG. 1) of semiconductor device 20d and corresponding contacts 34 (FIG. 1) of carrier 30. In other embodiments, intermediate conductive elements 35 (see, e.g., FIG. 8) may be formed or placed between contact pads 46' of redistribution layer 40' that are located adjacent to one or more peripheral edges 21 of semiconductor device 20d and corresponding contacts 34 of carrier 30. This type of arrangement provides for a more direct electrical connection between carrier 30 and circuitry of redistribution layer 40'.

Once all of the semiconductor devices 20 are in place upon and electrically connected to carrier 30, an exposed surface 42' of redistribution layer 40' and, optionally, intermediate conductive elements 25, 35 (FIG. 8) may be covered with a suitable encapsulant 50. Known processes, such as molding (e.g., transfer molding, pot molding, injection molding, etc.) techniques may be used to apply encapsulant material to redistribution layer 40' and, optionally, over intermediate conductive elements 25, 35, to form encapsulant 50.

Figure 3:
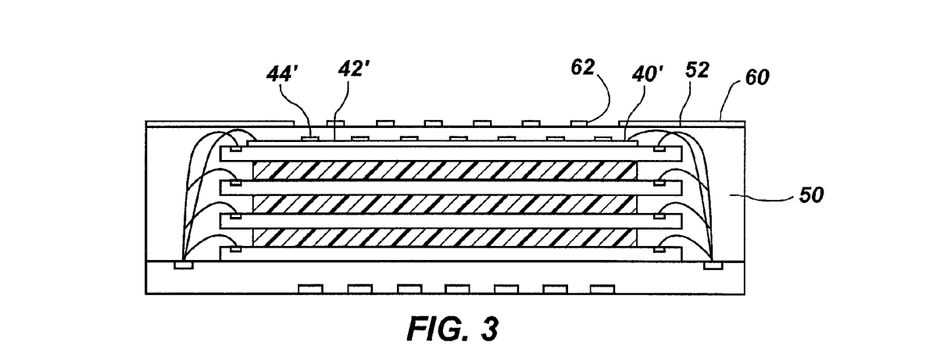
Figure 4:
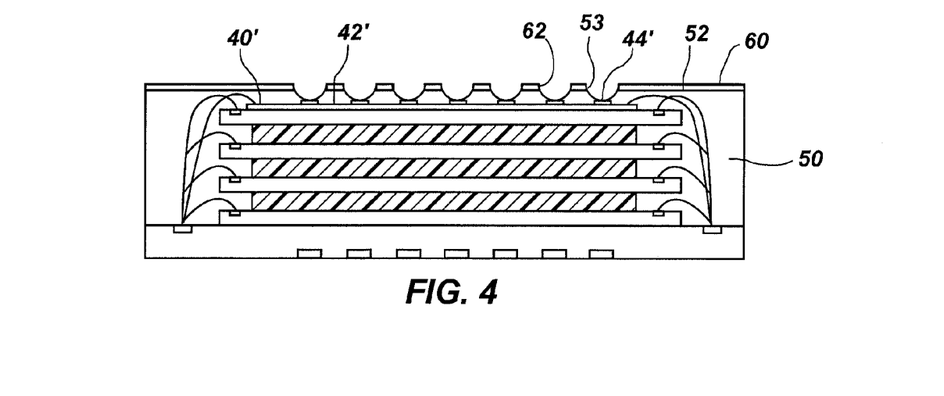
Figure 5:
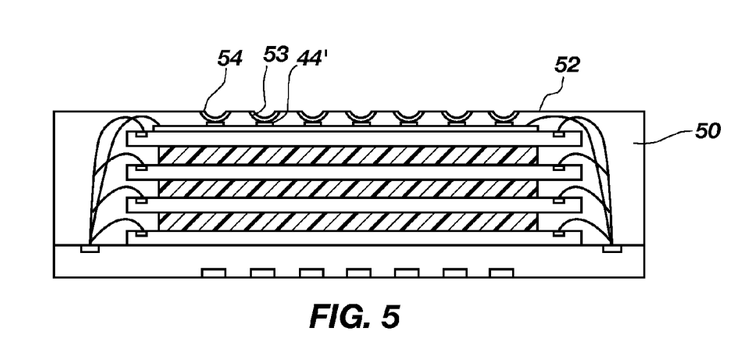

Initially, in embodiments such as that depicted in FIG. 2, encapsulant 50 may completely cover the previously exposed surface 42' of redistribution layer 40'. As shown in FIGS. 3 and 4, contact pads 44' that are arranged over surface 42' of redistribution layer 40' may thereafter be exposed through encapsulant 50. FIG. 3 depicts an embodiment in which a mask 60 is formed (e.g., by exposure and development of photoresist, etc.) over a surface 52 of encapsulant 50 that overlies redistribution layer 40'. Apertures 62 are defined in mask 60 at locations over the contact pads 44' that are to be exposed. The assembly is then exposed to a suitable etchant or solvent, which removes from encapsulant 50 material that has been exposed through apertures 62 of mask 60. The removal of material from encapsulant 50 may be effected without substantially or completely removing mask 60. Such material removal may continue until apertures 53, through which the desired contact pads 44' have been exposed, have been formed in surface 52 of encapsulant 50.

In a variation of the method, apertures 53 may be formed by known laser ablation processes.

In another variation of the method, apertures 53 may be formed during the formation of encapsulant 50. In one particular embodiment, the mold, or encapsulation, tooling that is used to for encapsulant 50 may include protrusions that align with contact pads 44' that are to be exposed and define apertures 53 over these contact pads 44'. These protrusions may be lined with a somewhat compressible film mold assist material, such as a polytetrafluoroethylene (PTFE), a perfluoroalkoxy (PFA), or a fluorinated ethylene propylene (EP) to prevent the formation of "flash," a thin layer of encapsulant material, over contact pads 44'.

In embodiments of the method where apertures 53 are formed without chemically removing (e.g., etching, dissolving, etc.) material from encapsulant 50, mask 60 may be subsequently formed, as shown in FIG. 4.

With apertures 53 formed and mask 60 (still) in place over surface 52, apertures 53 and the contact pads 44' exposed therethrough may be coated with a conductive lining 54. In one embodiment, conductive lining 54 may be formed by depositing (e.g., by known physical vapor deposition (PVD) processes, known chemical vapor deposition (CVD) processes, etc.) conductive material over mask 60 and onto surfaces of apertures 53. The deposited conductive material may form a complete conductive lining 54 over the surfaces of each aperture 53, or it may form a seed layer for subsequent plating (e.g., electrolytic plating, electroless plating, immersion plating, etc.) processes, which complete the conductive lining 54.

Once conductive linings 54 have been formed in apertures 53, conductive material may, in some embodiments, be removed from other locations of encapsulant 50 (i.e., from above surface 52) as mask 60 is removed. This removal of conductive material may be accomplished by known lift-off techniques, in which the structure is exposed to a suitable chemical (e.g., a resist strip in embodiments where mask 60 has been formed from a photoresist, an etchant in embodiments where mask 60 is formed from another material), and results in the structure shown in FIG. 5.

Figure 6:
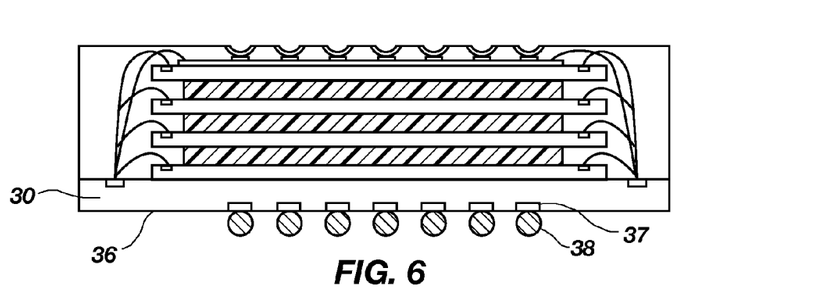

As FIG. 6 shows, discrete conductive structures 38 may be applied to contacts 37 on a bottom surface 36 of carrier 30 by known processes. In embodiments where discrete conductive structures 38 are formed from solder or another metal or metal alloy, they may be formed by screen printing metallic paste onto contacts 37 and reflowing the same. Alternatively, they may be formed by use of a bath of molten metal or by employing a wave of molten metal. In other embodiments, discrete conductive structures 38 may be formed by placing conductive material or securing preformed conductive structures to contacts 37.

Another embodiment of a process for assembling a semiconductor device package 10 (FIG. 1) according to an embodiment of the present invention is shown in FIGS. 7 through 12.

Figure 7:
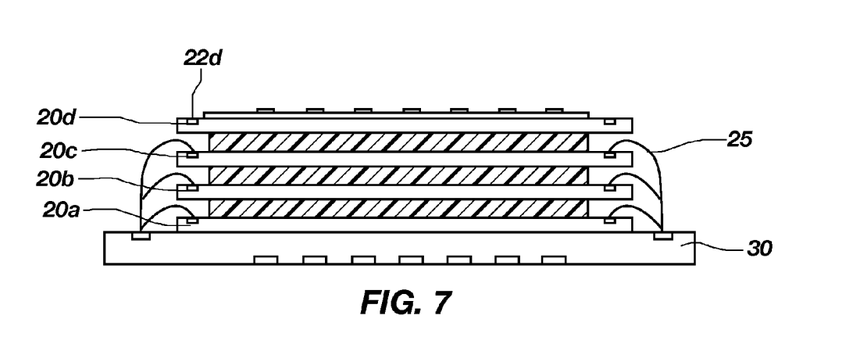
FIGS. 7 through 12 illustrate another embodiment of a method for assembling and packaging semiconductor devices.

As depicted by FIG. 7, one or more semiconductor devices 20a, 20b, 20c are secured in place over and electrically connected to carrier 30. A lowermost semiconductor device 20a may be secured to carrier 30 with a suitable adhesive material or adhesive-coated element of a type known in the art. Communication may be established between contact pads 24 (FIG. 1) of each semiconductor device 20a, 20b, 20c and corresponding contacts 34 (FIG. 1) of carrier 30 (i.e., they may be electrically connected to one another) by forming or placing intermediate conductive elements 25 therebetween.

In embodiments where the resulting semiconductor device package 10 is to include more than one semiconductor device 20, an uppermost semiconductor device 20d is positioned over and secured to another semiconductor device 20c. An interposer 40" (FIG. 8) may then be positioned over and secured to a surface 22d (FIG. 1) of the uppermost semiconductor device 20d.

Figure 8:
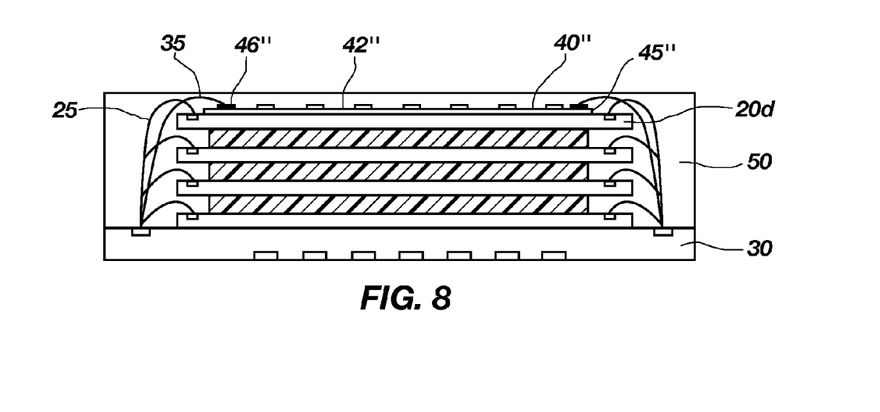

In some embodiments, such as that shown in FIG. 8, interposer 40" is positioned over semiconductor device 20d before contact pads 24d (FIG. 1) of semiconductor device 20d are electrically connected to corresponding contacts 34 (FIG. 1) of carrier 30. In these embodiments, intermediate conductive elements 25 may then be formed or placed and electrically coupled between contact pads 24d and their corresponding contacts 34. In addition, as FIG. 8 also shows, contact pads 46" at or near one or more peripheral edges 45" of interposer 40" may be electrically connected to corresponding contacts 34 of carrier 30 by forming or placing and electrically coupling intermediate conductive elements 35 therebetween.

Figure 9:
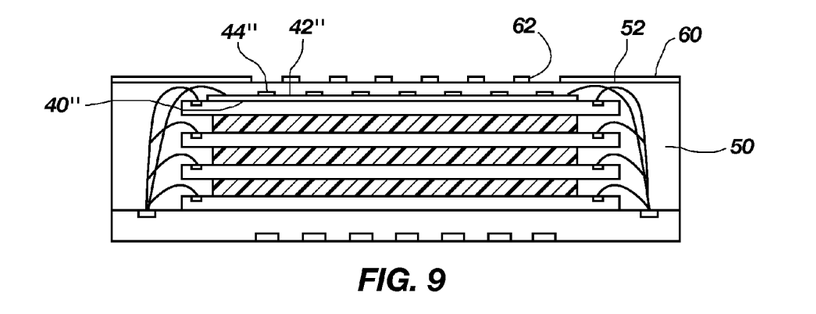
Figure 10:
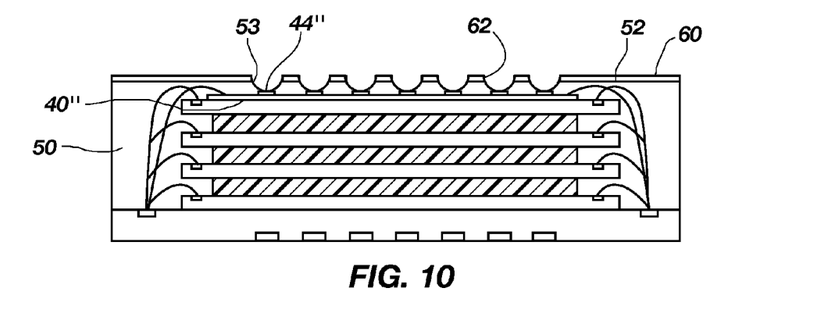

With continued reference to FIG. 8, an encapsulant 50 may be formed over an exposed surface 42" of interposer 40". Additionally, encapsulant 50 may laterally surround semiconductor devices 20, as well as portions of intermediate conductive elements 25, 35 that extend laterally therefrom. Encapsulant 50 may be formed by known processes, including, without limitation, known molding processes. Encapsulant 50 may, at first, completely cover the previously exposed surface 42" of interposer 40". Thereafter, as shown in FIGS. 9 and 10, contact pads 44" that are arranged over surface 42" of interposer 40" may be exposed through encapsulant 50. As shown in FIG. 9, a mask 60 may be formed (e.g., by exposure and development of photoresist, etc.) over a surface 52 of encapsulant 50 that overlies interposer 40". Apertures 62 are defined in mask 60 at locations over the contact pads 44" that are to be exposed. The assembly is then exposed to a suitable solvent or etchant, which removes from encapsulant 50 material that has been exposed through apertures 62 of mask 60. The material of encapsulant 50 may, in some embodiments, be removed without substantially or completely removing mask 60. Material may be removed through mask 60 until apertures 53, through which the desired contact pads 44" have been exposed, have been formed in surface 52 of encapsulant 50.

In another embodiment, apertures 53 may be defined without the use of a mask. Such an embodiment includes the use of known laser ablation techniques to remove material from encapsulant 50 and to expose one or more contact pads 44" therethrough.

In other embodiments, apertures 53 may be formed as encapsulant 50 is formed. In one such embodiment, the mold, or encapsulation, tooling that is used to form encapsulant 50 may include protrusions that align with contact pads 44" that are to be exposed and define apertures 53 over these contact pads 44". These protrusions may be lined with a somewhat compressible film mold assist material, such as a polytetrafluoroethylene (PTFE), a perfluoroalkoxy (PFA), or a fluorinated ethylene propylene (FEP) to prevent the formation of "flash," a thin layer of encapsulant material, over contact pads 44".

Figure 11:
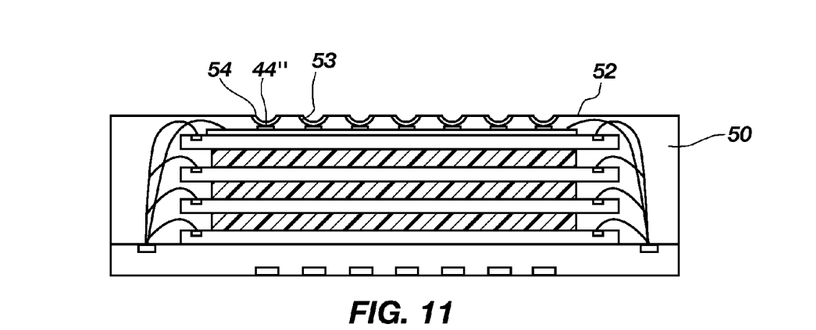

In any event, as shown in FIG. 10, a mask 60 may be present on a surface 52 of an encapsulant 50 in which apertures 53 are recessed. With apertures 53 formed and mask 60 in place over surface 52, a conductive lining 54 may be formed over surfaces of apertures 53 and on the contact pads 44" exposed therethrough, as illustrated by FIG. 11. Known processes, including deposition processes (e.g., PVD, CVD, etc.) and/or known plating processes (e.g., electrolytic plating, electroless plating, immersion plating, etc.) may be used to form a conductive lining 54 within each aperture 53.

As the processes that are used to form each conductive lining 54 may also leave conductive material over other areas of surface 52, the conductive material may be removed from these areas. In some embodiments, the removal of conductive material from above surface 52 may be effected by known lift-off techniques, in which mask 60 (FIG. 10) is exposed to a suitable chemical (e.g., a resist strip in embodiments where mask 60 has been formed from a photoresist, an etchant in embodiments where mask 60 is formed from another material).

Figure 12:
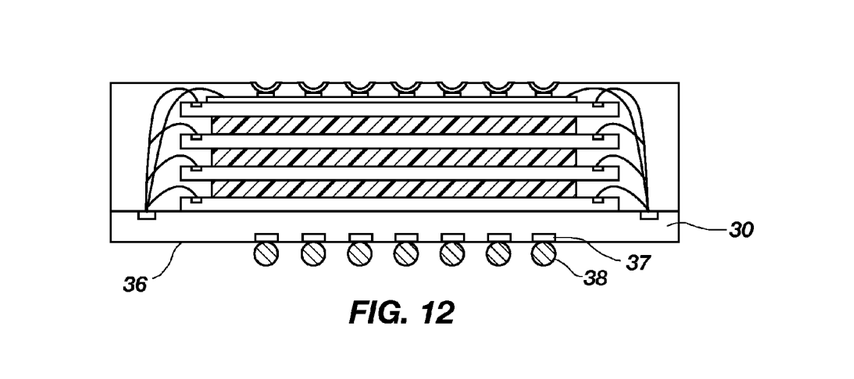

The structure that results from these processes, an embodiment of which is depicted in FIG. 12, may be further processed by the addition of discrete conductive structures 38 to contacts 37 on a bottom surface 36 of carrier 30. Discrete conductive structures 38 may be formed on or secured to contacts 37 by a variety of processes that are known in the art. In embodiments where discrete conductive strictures 38 are formed from solder or another metal or metal alloy, they may be formed by screen printing metallic paste onto contacts 37 and reflowing the same. Alternatively, they may be formed by use of a bath of molten metal or by employing a wave of molten metal. In other embodiments, discrete conductive structures 38 may be formed by placing conductive material or securing preformed conductive structures to contacts 37.

A semiconductor device package 10 that incorporates teachings of the present invention may be used for a variety of purposes. Various embodiments of the manner in which one or more semiconductor device packages 10 may be utilized are described in reference to FIGS. 13 through 15.

Figure 13:
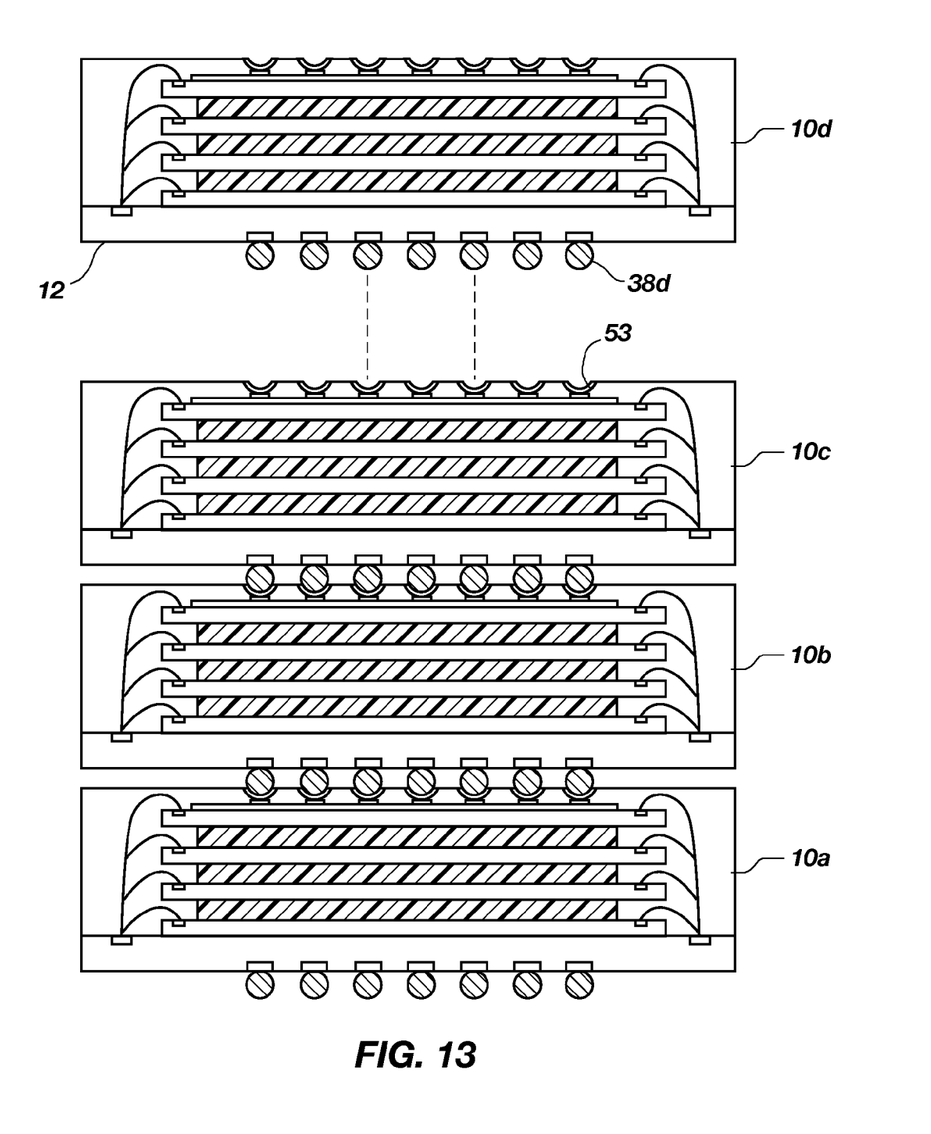
FIG. 13 shows an embodiment of an assembly including multiple semiconductor device packages.

In the embodiment depicted by FIG. 13, two or more semiconductor device packages 10a, 10b, 10c, etc., (which are also collectively referred to hereinafter, for the sake of simplicity, as "semiconductor device packages 10") according to embodiments of the present invention (four are shown) are interconnected to one another. All of the semiconductor device packages 10 may have the same functionality (e.g., DRAM, NAND flash memory, etc.), or they may combine different functionalities (e.g., multiple types of memory, one or more types of memory and processing capabilities, etc.).

Semiconductor device packages 10 may be assembled simply by inserting discrete conductive structures 38 (e.g., discrete conductive structures 38d) that protrude from a base 12 of one package 10 (e.g., semiconductor device package 10d) into corresponding apertures 53 of another package 10 (e.g., semiconductor device package 10c), with each discrete conductive structure 38 (e.g., discrete conductive structures 38d) contacting the contact pad 44 (FIG. 1) and/or any conductive lining 54 (FIG. 1) with its corresponding aperture 53. In some embodiments, electrical contact between a discrete conductive structure 38 (e.g., discrete conductive structures 38d) and its corresponding contact pad 44 and/or conductive lining 54 may be established and maintained by reflowing the material from which the discrete conductive structure 38 (e.g., discrete conductive structures 38d) is formed. In other embodiments, electrical contact may be established and maintained by way of a mechanical interaction, such as with an interference fit or by simply forcing, or physically biasing, the interconnected packages 10 toward one another and maintaining that physical bias.

Assembly of semiconductor device packages 10 in the manner shown in and described with reference to FIG. 13 may be employed as a final process in the packaging of semiconductor devices, or it may be used post-production to upgrade the functionality of (e.g., expand an existing functionality of or add functionality to) previously installed semiconductor devices (e.g., by repair technicians, consumers, etc.).

Figure 14:
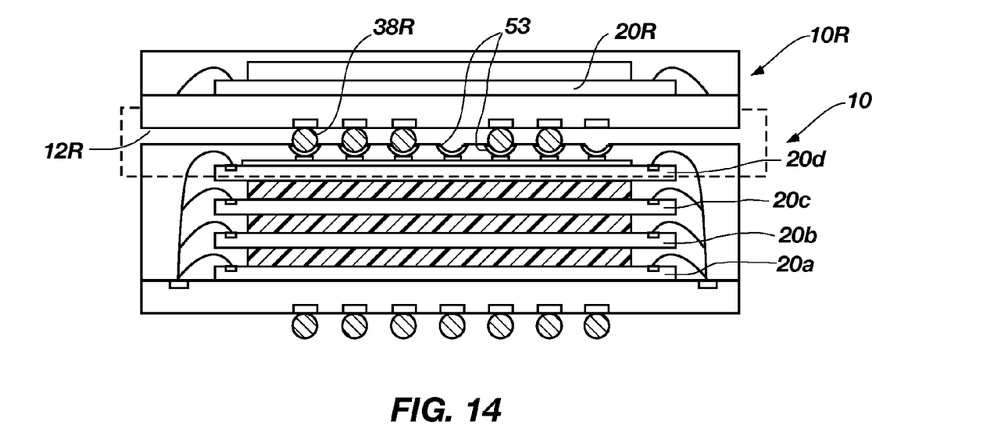
FIG. 14 depicts another embodiment of an assembly that includes multiple semiconductor device packages.
Figure 15:
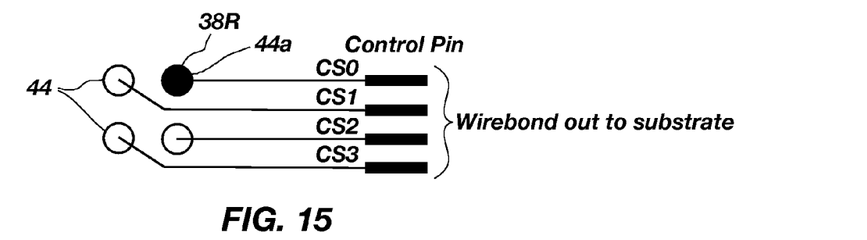
FIG. 15 provides a representation of an embodiment of the manner in which a defective semiconductor device of a semiconductor device package according to an embodiment of the present invention may be effectively replaced.

FIGS. 14 and 15 illustrate an embodiment of a technique for repairing a semiconductor device package 10 that includes one or more defective semiconductor devices 20. As shown in FIG. 14, a repair package 10R, which includes at least one replacement device 20R, is assembled with a defective semiconductor device package 10. More specifically, discrete conductive structures 38R that protrude from a base 12R of repair package 10R are inserted into corresponding apertures 53 of the defective semiconductor device package 10, electrically contacting contact pads 44 (FIG. 1) and/or conductive liners 54 (FIG. 1) within those apertures 53. Discrete conductive structures 38R of repair package 10R protrude from locations that will align with a group of chip select pads 44 that correspond to the defective semiconductor device 20, as shown in FIG. 15. In the illustrated embodiment, replacement package 10R is intended to replace semiconductor device 20a ("chip 0"). Accordingly, each of the discrete conductive structures 38R that protrudes from base 12R of replacement package 10R is positioned to align with an aperture 53 that exposes a contact pad 44a (of "chip set 0" or "CS0") that corresponds to semiconductor device 20a. If another semiconductor device 20 of semiconductor device package 10 were defective, discrete conductive structures 38R would instead protrude locations that align with contact pads 44 (e.g., CS1, CS2 CS3, etc.) that correspond to that defective semiconductor device 20.

Figure 16:
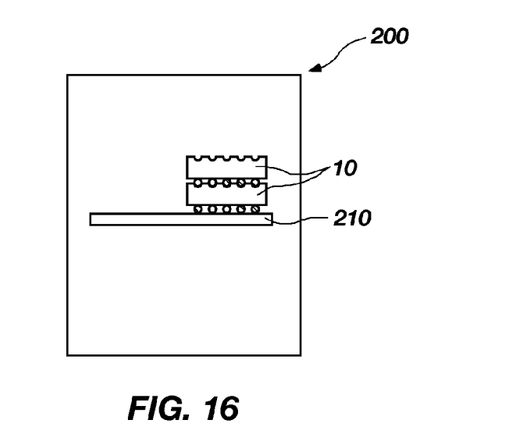
FIG. 16 schematically depicts an electronic device including a semiconductor device package with at least one contact pad of a redistribution element exposed through an encapsulant of the package.

Turning now to FIG. 16, an electronic device 200, such as a computer, controller, cellular telephone, portable digital music player, digital camera, or the like is depicted. Electronic device 200 includes a circuit board 210 to which at least one semiconductor device package 10 according to embodiments of the present invention is electrically connected. In the illustrated embodiment, electronic device 200 includes two semiconductor device packages 10 that are electrically connected to each other.

In summary, the present invention includes embodiments of semiconductor device packages with one or more semiconductor devices that are borne by and electrically connected to a carrier. In embodiments that include more than one semiconductor device, the semiconductor devices may be stacked one on another. In addition to the carrier and one or more semiconductor devices, a semiconductor device package of the present invention includes a redistribution element atop an uppermost semiconductor device. The redistribution element communicates with one or more (e.g. all) semiconductor devices of the package. Contact pads that are arranged in an array over a surface of the redistribution element enable the connection of one or more additional semiconductor device packages to the package. The contact pads may be exposed through apertures formed in an encapsulant, which apertures may facilitate alignment of corresponding discrete conductive structures that protrude from an additional semiconductor device package with the appropriate contact pads of the redistribution element. This arrangement facilitates repair of and upgrades to packages, or multi-chip modules, that include a plurality of semiconductor devices, without requiring that the entire package be discarded and that any operable semiconductor devices thereof, or data stored thereby, be needlessly wasted. The present invention also includes methods for assembling and packaging semiconductor devices, as well as methods for assembling multiple packages, including methods for replacing the functionality of one or more defective semiconductor devices of a package according to embodiments of the present invention.

Although the foregoing description contains many specifics, these should not be construed as limiting the scope of the present invention, but merely as providing illustrations of some embodiments. Similarly, other embodiments of the invention may be devised which lie within the scope of the present invention. Features from different embodiments may be employed in combination. The scope of the invention is, therefore, indicated and limited only by the appended claims and their legal equivalents, rater than by Me foregoing description. All additions, deletions and modifications to the invention as disclosed herein which fall within the meaning and scope of the claims are to be embraced thereby.

What is claimed:

1. A semiconductor device package, comprising:
   a carrier with a plurality of contact pads on a first surface thereof;
   at least one semiconductor device carried on the first surface of the carrier, the at least one semiconductor device including an active surface bearing a plurality of contact pads;
   a redistribution element including a plurality of contact pads and located on the active surface of the at least one semiconductor device;
   at least one intermediate conductive element extending between and electrically connecting at least one contact pad of the carrier and at least one contact pad of the at least one semiconductor device; and
   an encapsulant located at least over the redistribution element and including apertures through which at least some of the plurality of contact pads of the redistribution element are individually exposed for electrical contact.

2. The semiconductor device package of claim 1, further comprising at least another intermediate conductive element establishing communication between at least one contact pad of the carrier and at least one contact pad of the redistribution element.

3. The semiconductor device package of claim 2, wherein the at least another intermediate conductive element extends between the at least one contact of the carrier and a contact pad of the at least one semiconductor device, with the contact pad of the at least one semiconductor device in communication with the at least one contact pad of the redistribution element.

4. The semiconductor device package of claim 2, wherein the at least another intermediate conductive element extends between the at least one contact pad of the carrier and at least one peripheral contact pad of the plurality of contact pads of the redistribution element, with the at least one peripheral contact pad of the plurality of contact pads of the redistribution element in communication with at least another contact pad of the plurality of contact pads of the redistribution element.

5. The semiconductor device package of claim 1, wherein the apertures are each configured to receive a discrete conductive structure protruding from another semiconductor device.

6. The semiconductor device package of claim 1, further comprising:
   a conductive lining on at least one of a surface of the encapsulant surrounding the apertures through which the at least some contact pads of the redistribution elements are exposed and exposed contact pads of the redistribution element.

7. The semiconductor device package of claim 1, further comprising at least one other semiconductor device carried on the first surface of the carrier, the at least one semiconductor device stacked on the at least one other semiconductor device and the at least one other semiconductor device comprising contact pads electrically connected to contact pads of the carrier with intermediate conductive elements.

8. The semiconductor device package of claim 7, wherein the redistribution element includes a plurality of chip select groups of contact pads, each chip select group comprising a plurality of contact pads corresponding to one semiconductor device of the stacked semiconductor devices.

9. The semiconductor device package of claim 1, wherein the redistribution element comprises at least one of a redistribution layer and an interposer.

10. A multi-package assembly, comprising:
a first semiconductor device package, including:
   a carrier;
   at least one semiconductor device carried on and electrically coupled to the carrier;
   a redistribution element on an active surface of an uppermost semiconductor device carried on and electrically coupled to the carrier, with a plurality of contact pads arranged over a surface of the redistribution element; and
   an encapsulant covering the surface of the redistribution element, contact pads of the plurality being exposed for electrical contact through a like number of apertures in the encapsulant; and
a second semiconductor device package, including:
   a carrier including a base with a plurality of discrete conductive structures protruding therefrom, each discrete conductive structure electrically contacting a corresponding contact pad of the plurality of contact pads of the redistribution element of the first semiconductor device package exposed through an aperture; and
   at least one semiconductor device electrically coupled to the carrier.

11. The multi-package assembly of claim 10, wherein the at least one semiconductor device of the second semiconductor device package expands an existing functionality of the first semiconductor device package, adds another functionality to a functionality of the first semiconductor device package, or replaces at least one defective semiconductor device of the first semiconductor device package.

12. The multi-package assembly of claim 10, wherein the second semiconductor device package further includes:
   a redistribution element on the second semiconductor device, with a plurality of contact pads arranged over a surface of the redistribution element; and
   an encapsulant covering the surface of the redistribution element, contact pads of the plurality being exposed through a like number of apertures in the encapsulant.

13. An electronic device, comprising:
at least one circuit board;
at least one semiconductor device package, including:
   a carrier electrically connected to the at least one circuit board;
   a plurality of stacked semiconductor devices in stacked on the carrier with active surfaces of the stacked semiconductor devices facing away from the carrier;
   a redistribution element on an active surface of an uppermost semiconductor device of the plurality of stacked semiconductor devices, the redistribution element including an array of contact pads; and
   an encapsulant at least over the active surface of the uppermost semiconductor device comprising apertures through which the array of contact pads of the redistribution element are individually exposed for electrical contact.

14. The electronic device of claim 13, further comprising:
at least another semiconductor device package including a plurality of discrete conductive structures protruding from a base thereof, the plurality of discrete conductive structures at least partially received within apertures through the encapsulant of the at least one semiconductor device package and contacting corresponding contact pads of the array.

15. The semiconductor device package of claim 1, further comprising discrete conductive elements protruding from a second surface of the carrier electrically connected to contact pads of the plurality of contact pads of the carrier.

16. The semiconductor device package of claim 1, wherein the encapsulant extends over the at least one semiconductor device, the at least one intermediate conductive element and the first surface of the carrier.

17. The semiconductor device package of claim 8, wherein one of the stacked semiconductor devices is defective, and further comprising another semiconductor device package connected to a chip select group of contact pads corresponding to the defective semiconductor device by a like number of discrete conductive elements at least partially disposed in apertures through which the chip select group of contact pads corresponding to the defective semiconductor device are exposed.

18. The multi-package assembly of claim 10, further comprising at least one other semiconductor device carried on the carrier, the at least one semiconductor device stacked on the at least one other semiconductor device and the at least one other semiconductor device electrically coupled to the carrier.

19. The multi-package assembly of claim 18, wherein the redistribution element includes a plurality of chip select groups of contact pads, each chip select group comprising a plurality of contact pads corresponding to one semiconductor device of the stacked semiconductor devices.

20. The electronic device of claim 14, wherein the redistribution element includes a plurality of chip select groups of contact pads, each chip select group comprising a plurality of contact pads corresponding to one semiconductor device of the stacked semiconductor devices.

21. The electronic device of claim 20, wherein one of the stacked semiconductor devices is defective, and wherein a semiconductor device of the at least another semiconductor device package is connected to a chip select group of contact pads corresponding to the defective semiconductor device by a like number of discrete conductive elements at least partially disposed in apertures through which the chip select group of contact pads corresponding to the defective semiconductor device are exposed.

22. The electronic device of claim 14, wherein at least one semiconductor device of the at least another semiconductor device package at least one of expands an existing functionality of the at least one semiconductor device package, adds another functionality to a functionality of the at least one semiconductor device package, and replaces at least one defective semiconductor device of the at least one semiconductor device package.

* * * * *

UNITED STATES PATENT AND TRADEMARK OFFICE
CERTIFICATE OF CORRECTION

PATENT NO. : 8,125,092 B2
APPLICATION NO. : 12/107622
DATED : February 28, 2012
INVENTOR(S) : David J. Corisis et al.

Page 1 of 1

It is certified that error appears in the above-identified patent and that said Letters Patent is hereby corrected as shown below:

In column 11, line 46, in Claim 13, after "devices" delete "in stacked".

Signed and Sealed this
Fifteenth Day of May, 2012

David J. Kappos
*Director of the United States Patent and Trademark Office*